(12) United States Patent
Tao

(10) Patent No.: US 7,473,581 B2
(45) Date of Patent: Jan. 6, 2009

(54) WAFER STACKING PACKAGE METHOD

(75) Inventor: Su Tao, Kaohsiung (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 333 days.

(21) Appl. No.: 11/221,780

(22) Filed: Sep. 9, 2005

(65) Prior Publication Data

US 2006/0057776 A1  Mar. 16, 2006

(30) Foreign Application Priority Data

Sep. 10, 2004 (TW) .............................. 93127445 A

(51) Int. Cl.
*H01L 21/44* (2006.01)
(52) U.S. Cl. ...................... 438/109; 438/110; 257/686; 257/E21.614; 257/E23.085; 257/E25.006
(58) Field of Classification Search ................. 438/113, 438/108–110; 257/686, 724, 777, 783, E23.085, 257/E25.006, E25.013, E25.027, E25.03, 257/E21.614
See application file for complete search history.

(56) References Cited

U.S. PATENT DOCUMENTS

2004/0212080 A1 * 10/2004 Chen et al. ................... 257/712
2005/0095733 A1    5/2005 Priewasser et al.
2005/0179127 A1 *  8/2005 Takyu et al. ................. 257/724

FOREIGN PATENT DOCUMENTS

DE           10342980.8      *  9/2003

* cited by examiner

*Primary Examiner*—Quoc D Hoang
(74) *Attorney, Agent, or Firm*—Birch, Stewart, Kolasch & Birch, LLP

(57) ABSTRACT

A method of wafer stacking packaging. The method comprises providing a die array including a plurality of singulated first dies cut from a first wafer; providing a second wafer with inseparate the second dies and an adhesive layer on an active surface thereof; pre-cutting the second wafer to a specified depth from the active surface thereof; stacking the active surface of second wafer onto a backside of the first dies, wherein each of the second dies only stack on one of the first dies; thinning the second wafer from the backside thereof to form a plurality of singulated the second dies stacked on the first dies simultaneously.

20 Claims, 21 Drawing Sheets

WAFER STACKING PACKAGE METHOD

BACKGROUND

The invention relates a package method, and in particular to a wafer stacking package method.

In flip chip interconnect technology FC, pads are disposed on active surfaces of chips, and bumps are formed on the pads. Subsequent to the flip of a chip, the bumps are respectively connected to contacts of carriers, thus, internal circuits of carriers can be electrically connected to external electronics. Due to the applicability with high pin contact, small package area and short signal transferring path, flip chip interconnect technology is widely used. Typically, flip chip interconnect technology comprises flip chip ball grid array, FCBGA and flip chip pin grid array, FCPGA.

FIG. 1~FIG. 6 are cross sections of conventional flip chip ball grid array structures. Referring to FIG. 1, a thinned wafer 21 is provided, and an adhesive paste 22 is coated on backside thereof. As shown in FIG. 2, a wafer supporter 30 is provided for supporting the wafer 21, thus, the wafer 21 can be cut into chips 29. Referring to FIG. 3, a die 29 with the adhesive paste 22 thereon is taken out to be put on a predetermined area 40 of a substrate 60, as shown in FIG. 4, this chip can be referred to as a principal chip 31. Referring to FIG. 5, another chip 41, auxiliary chip, is taken out to be put on the principal chip for attachment using the adhesive paste 22. The principal and auxiliary chips 31 and 41 are wire 55 bonded to achieve a package, as shown in FIG. 6.

SUMMARY

These and other problems are generally solved or circumvented, and technical advantages are generally achieved, by preferred illustrative embodiments of the present invention, which provide a package method.

An embodiment of the invention provides a package method. An array chip on a first wafer comprising a plurality of independent first chips formed by cutting the first wafer is provided. A second wafer comprising a plurality of connected second chips is provided, wherein an adhesion layer is formed on active surfaces of the second chips.ABackground Gaps between the second chips are cut to a specified depth. The second chips are attached overlying the first chips with backside of the second chips facing the active surface of the first chips, wherein each of the second chips overlaps with only one of the first chips. The backside of the second chips is thinned, wherein a plurality of independent and separated second chips are disposed overlying the first chips to form a plurality of stack chips.

Another embodiment of the invention provides a wafer stacking package method. An array chip on a first wafer comprising a plurality of independent first chips formed by cutting the first wafer is provided. A thinned second wafer comprising a plurality of connected second chips is provided, wherein an adhesion layer is formed on an active surface of the second chips. Gaps between the second chips are cut to a specified depth to form a plurality of independent and separated second chips. The second chips are stacked overlying the first chips with active surfaces of the second chips facing backside of the first chips, wherein each of the second chips overlaps with only one of the first chips, and stack chips comprising the second chips overlying the first chips are simultaneously formed.

Further another embodiment of the invention provides a wafer stacking package method. A first wafer comprising a plurality of first chips, formed by pre-cutting the first wafer is provided. A second wafer comprising a plurality of connected second chips is provided, wherein an adhesion layer is formed on an active surface of the second chips. Gaps between the second chips are cut to a specified depth. The second chips are stacked overlying the first chips with the active surface of the second chips facing the backsides of the first chips, wherein each of the second chips overlaps with only one of the first chips. The backsides of the first chips and the second chips are thinned to simultaneously form a plurality of stack chips comprising the independent and separated second chips overlying the independent and separated first chips.

DESCRIPTION OF THE DRAWINGS

The invention can be more fully understood by reading the subsequent detailed description and examples with references made to the accompanying drawings, wherein.

DETAILED DESCRIPTION

Figure 1:
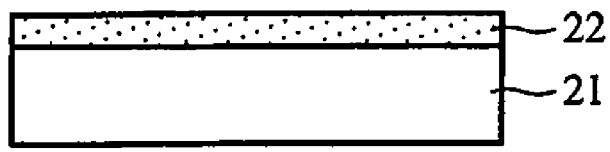
FIG. 1~FIG. 6 are cross sections of conventional flip chip ball grid array structures.
Figure 2:
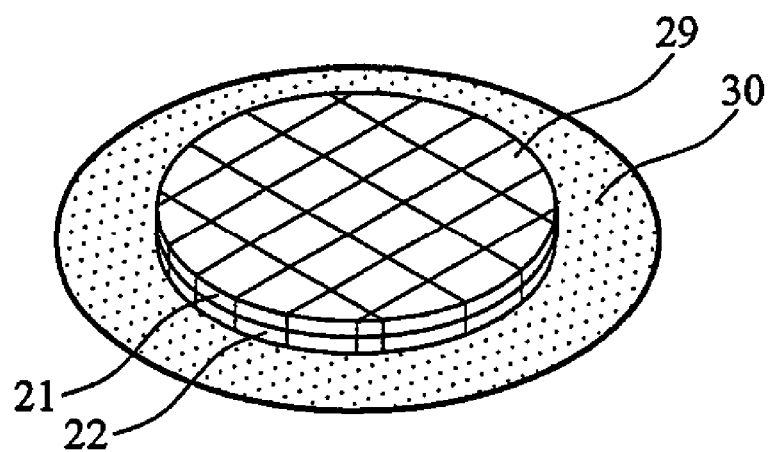
Figure 3:
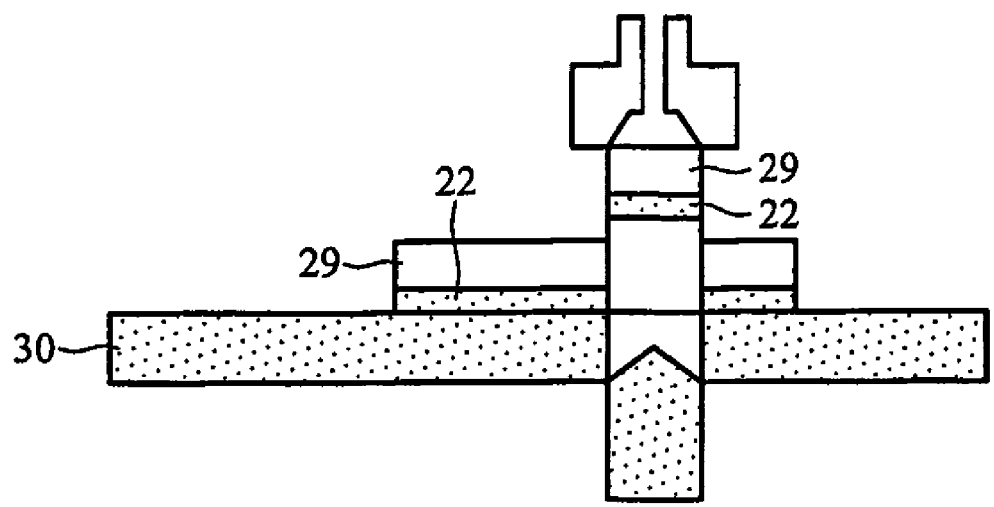
Figure 4:
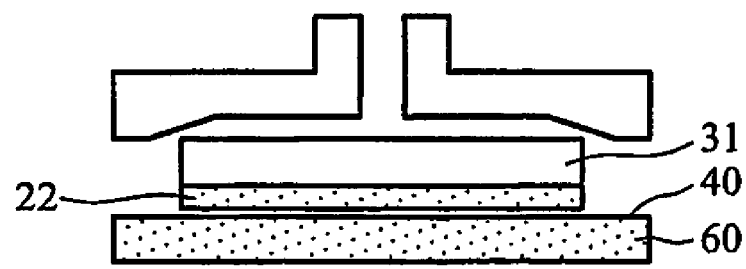
Figure 5:
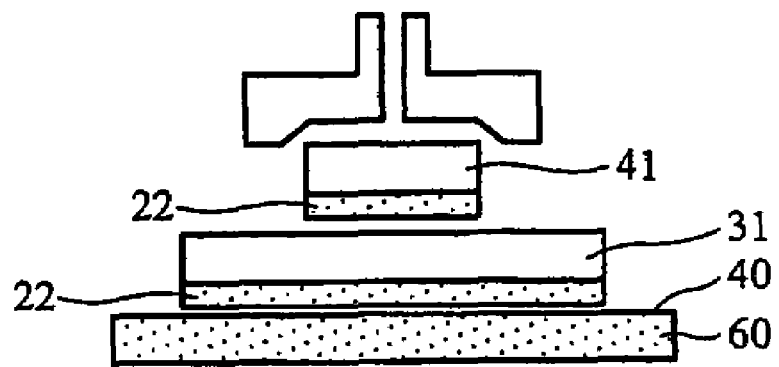
Figure 6:
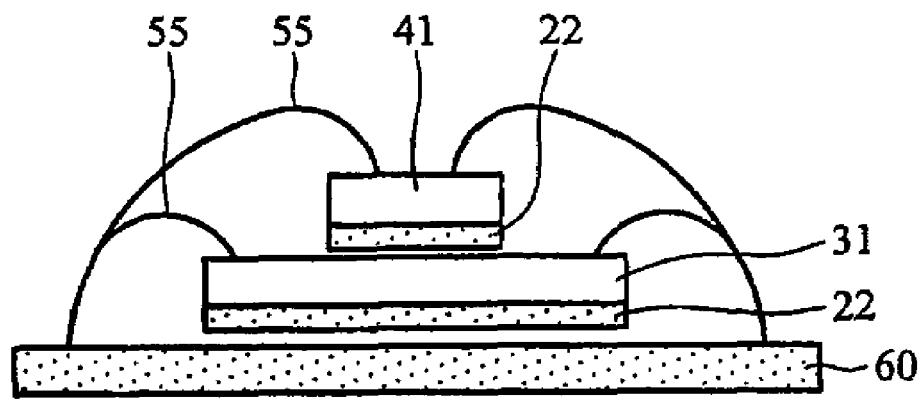
Figure 7A:
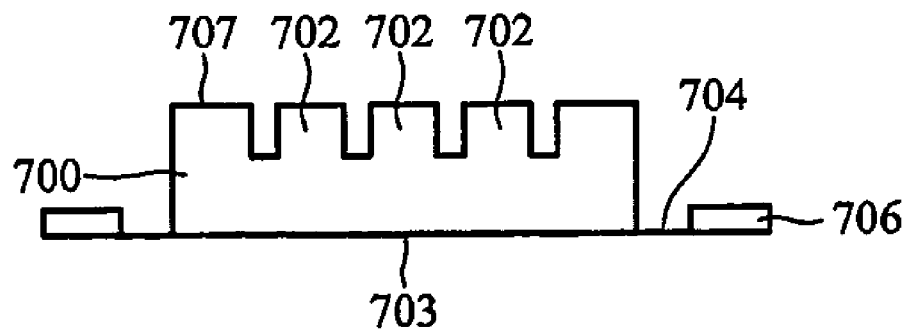
FIG. 7a~FIG. 7k illustrate a wafer stacking package method of an embodiment of the invention.

In FIG. 7a, a first wafer 700 with a chip array is provided, wherein the chip array comprises a plurality of non-separated first chips 702. Next, backside 703 of the wafer 700 is attached to a first film frame 706 comprising a tape 704. Next, the wafer 700 is precut to a predetermined depth from the active surface 707 to define a plurality of first chips 702 arranged with the same distance therebetween, wherein the depth is less than the thickness of the wafer 700.

Figure 7B:
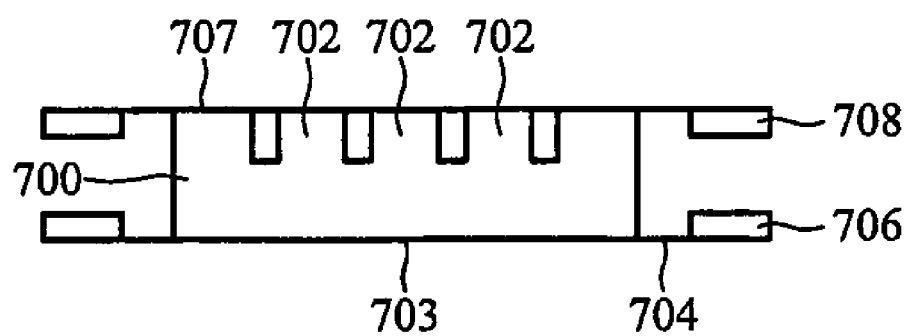
Figure 7C:
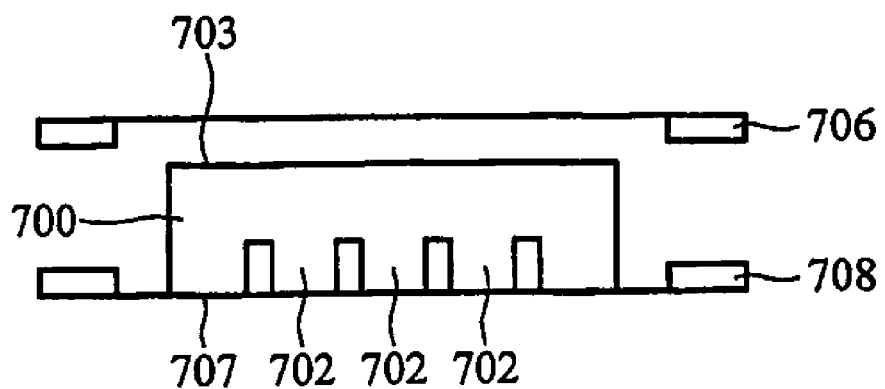
Figure 7D:
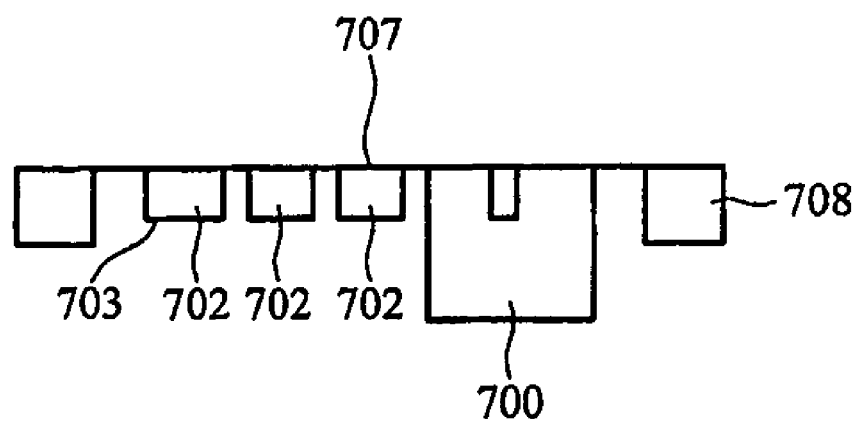

Referring to FIG. 7b, the second film frame 708 is attached to the active surface 707 of the precut first wafer 700 for fastening the first chips 702 in subsequent steps. Referring to FIG. 7c, the first wafer 700 is turned upside down using the second film frame 708, and the first film frame 706 is removed thereafter. Referring to FIG. 7d, backside 703 of the wafer 700 is recessed to form a plurality of independent first chips 702 on the second film frame 708. The recess step can be chemical mechanical polishing or mechanical polishing, the invention, however, is not limited thereto.

Figure 7E:
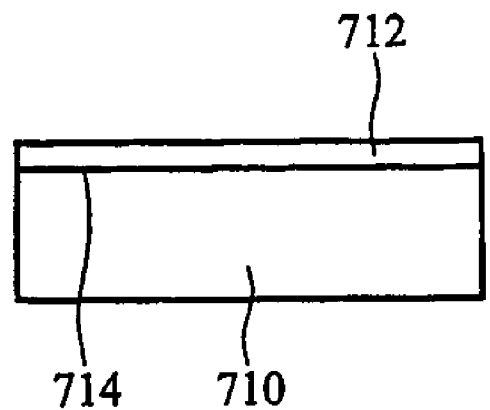

Referring to FIG. 7e, a second wafer 710 comprising a plurality of chips (not shown) separated from each other by a constant distance is provided. An adhesion layer 712 is formed on an active surface 714 of the second wafer 710, wherein the adhesion layer 712 covers the entire second wafer 710, or optionally covers a portion of the second wafer 710 overlapping the first chips 702. The adhesion layer 712 can comprise epoxy, thermal plastics and B-stage plastics formed by pasting with an automatic pasting apparatus, or preformed by direct bonding on the backside of the chips of the wafer.

Figure 7F:
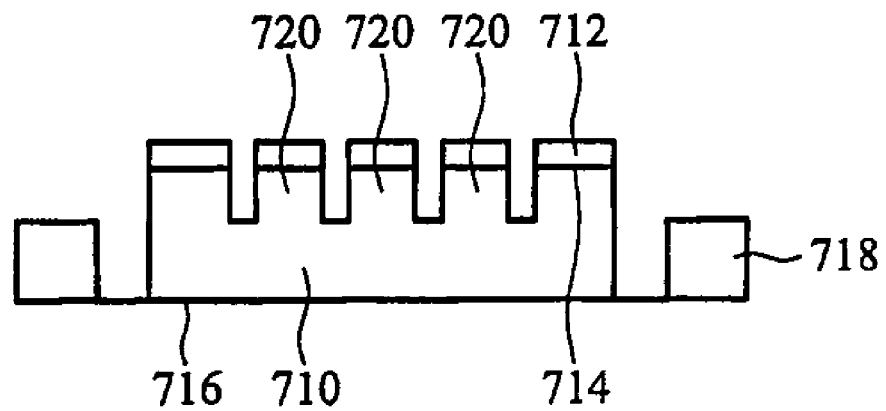

Referring to FIG. 7f, backsides 716 of chips of the second wafer 710 are bonded on a third film frame 718. Next, the adhesion layer 712 and the wafer 710 are cut to a specified depth, separating the chips 720, in which the depth is less than thickness of the wafer 710.

Figure 7G:
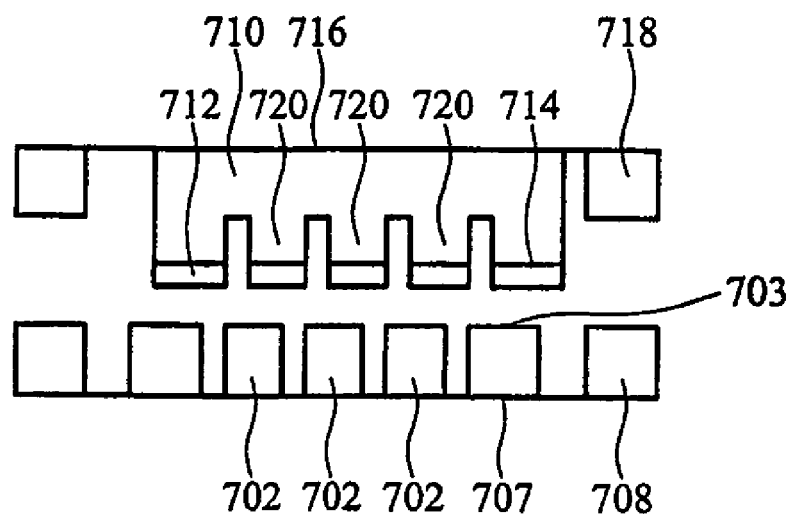
Figure 7H:
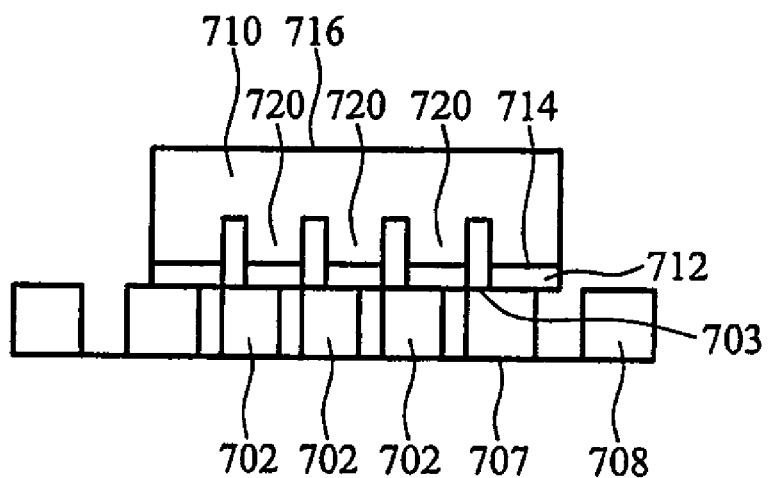

Referring to FIG. 7g, an important portion of the invention, second chips 720 of the second wafer and the first chips 702 are interlaced to expose at least a portion of the active surface of chips of the second wafers. Next, the chips 720 of the second wafer are bonded on the first chips 702 through the adhesion layer 712 by lamination. According to the aforementioned steps, a plurality of stack chips can be formed simultaneously. Next, the third film frame 718 is removed. An important feature of the invention is that each of the second chips 720 only overlaps a single first chip 702, as shown in FIG. 7h.

Figure 7I:
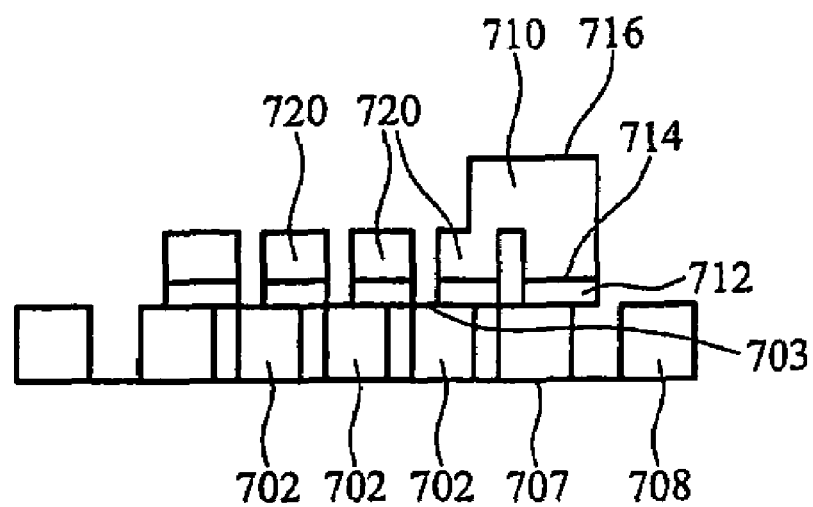
Figure 7J:
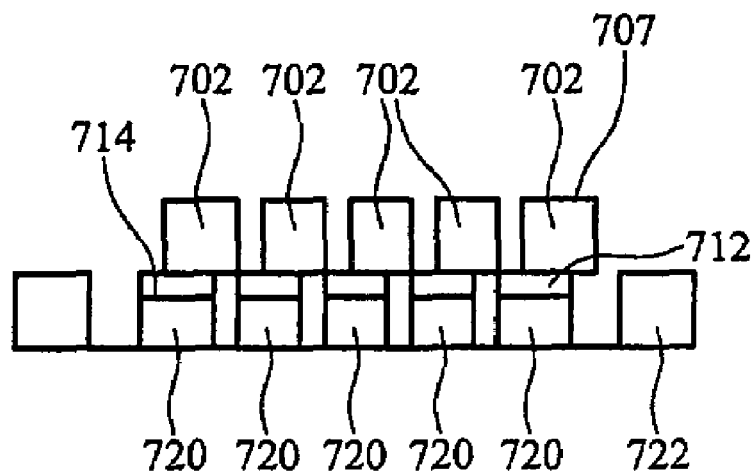
Figure 7K:
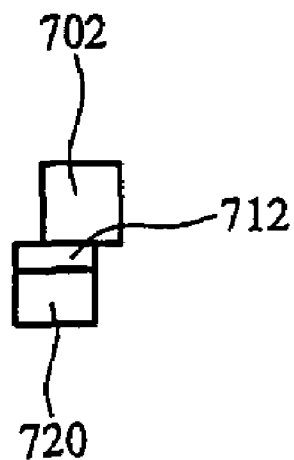

Next, referring to FIG. 7i, the second wafer 716 is thinned from the backside to form a plurality of completely independent second chips 720 overlying the first chips 702. According to the overlapping of each of the second chips 720 with only a single first chip 702, a plurality of independent stack chips are formed subsequent to thinning, in which the thinning process can comprise standard mechanical polishing or chemical mechanical polishing, but the invention is not limited thereto. Referring to FIG. 7j, the backsides of the second chips 720 are fastened using a fourth film frame 722, thus, the active surface 707 of the first chips 702 can face upward. Next, an individual stack chip can be taken using a pick and place robot arm.

Figure 8A:
FIG. 8a~FIG. 8c illustrate a wafer stacking package method of another embodiment of the invention.

Referring to FIG. 8a, a first wafer 800 comprising chip arrays (not shown) including a plurality of connected first chips is provided.

Figure 8B:
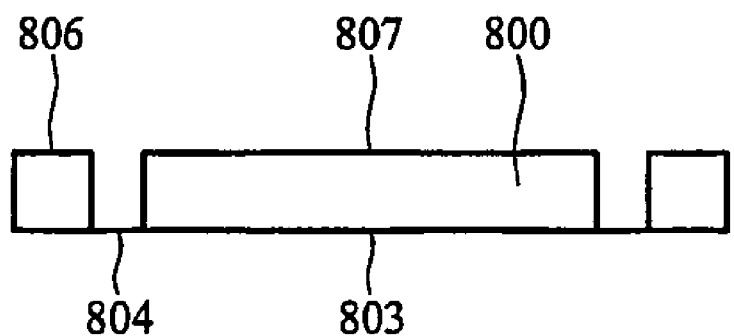

Referring to FIG. 8b, the wafer 800 is thinned at the backside 803, and the chips of the first wafer 800 are attached to a first film frame 806 comprising tape 804, thus, the chips can be fastened when separation is performed. The thinning step can comprise standard mechanical polishing, or chemical mechanical polishing, but the invention is not limited thereto.

Figure 8C:
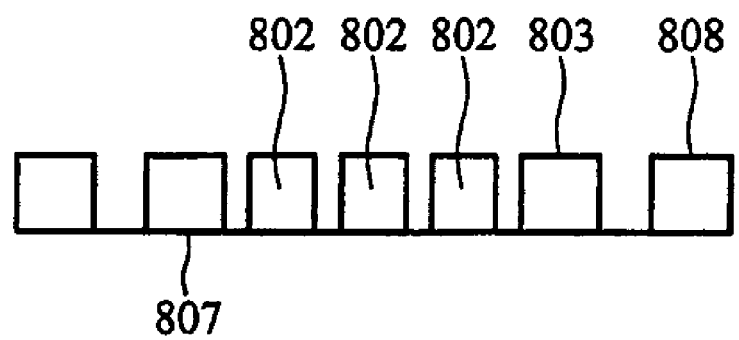

Referring to FIG. 8c, the active surface 807 of the first wafer 802 is cut to define a plurality of the first chips 802 separated from each other with a constant distance, wherein the cutting depth is less than thickness of the wafer 800. Next, the first wafer 800 is formed upside down using a second film frame 808. The first film frame 806 is then removed, thus, the individual first chips 802 are formed overlying the second film frame 808. The steps for forming individual stack chips are similar to the aforementioned embodiment, and it can be referenced thereto.

Figure 9A:
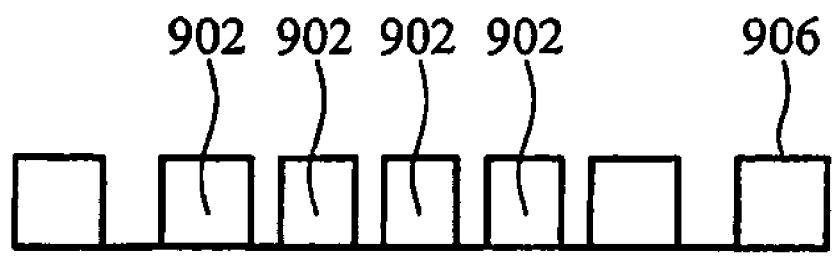
FIG. 9a~FIG. 9f illustrate a wafer stacking package method of further another embodiment of the invention.

Referring to FIG. 9a, a chip array comprising a plurality of first chips 902 on a film frame 906 is provided. The first chips 902 are formed by cutting a first wafer, in which related steps can refer to the aforementioned embodiments.

Figure 9B:
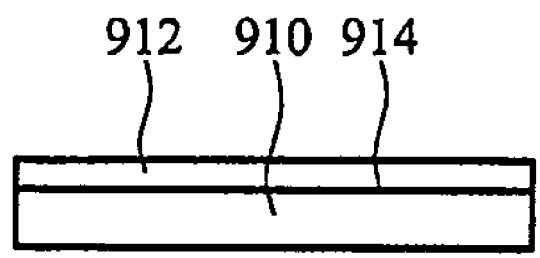

Referring to FIG. 9b, a thinned second wafer 910 comprising a plurality of chips (not shown) separated from each other by a constant distance is provided. An adhesion layer 912 is formed on active surfaces 914 of the second wafer 910, wherein the adhesion layer 912 covers the entire second wafer 910, or optionally covers a portion of the second wafer 910 overlapping the first chips 902. The adhesion layer 912 can comprise epoxy, thermal plastics and B-stage plastics formed by pasting with an automatic pasting apparatus, or pre-formed by direct bonding on the backside of the chips of the wafer.

Figure 9C:
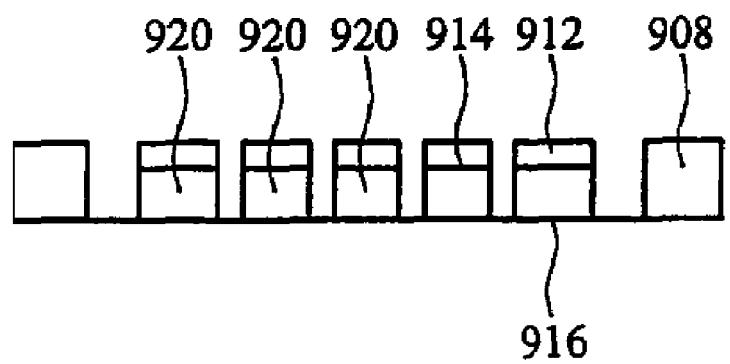

Referring to FIG. 9c, backside 916 of chips of the thinned second wafer 910 is bonded on a second film frame 908. Next, the adhesion layer 912 and the wafer 910 are cut from an active surface 914 to a specified depth, separating the chips 920, in which the depth is less than thickness of the wafer 910.

Figure 9D:
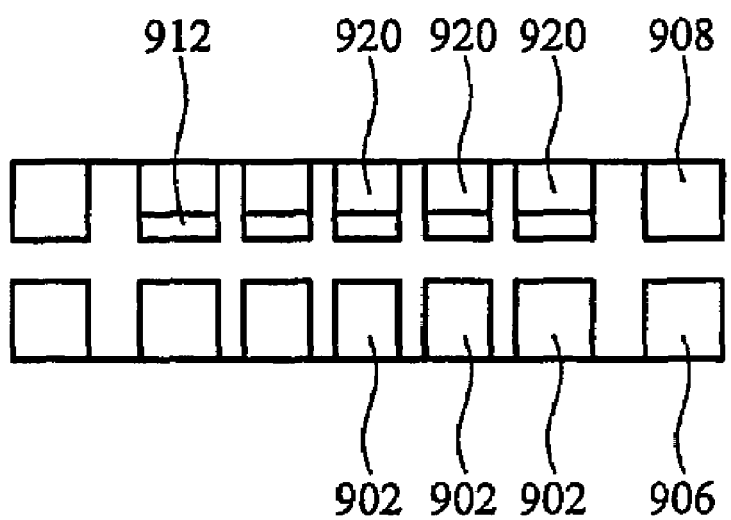
Figure 9E:
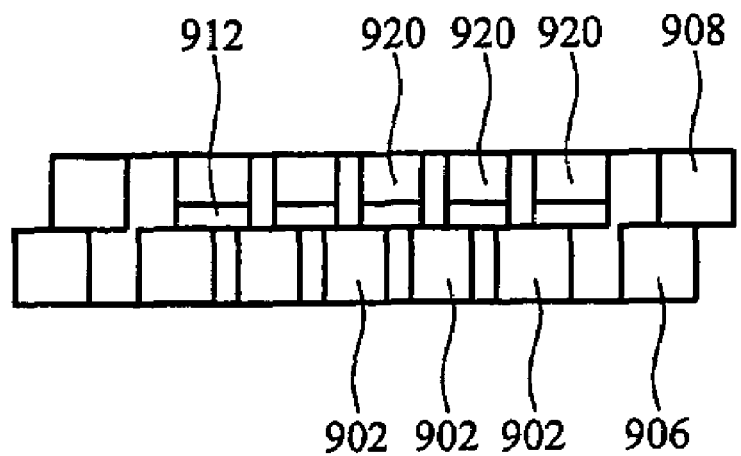

Referring to FIG. 9d, chips 920 of the second wafer and the first chips 902 are interlaced, at least exposing a portion of active surface of chips 920 of the second wafers. Next, as shown in FIG. 9e, the chips 920 of the second wafer are bonded to the first chips 902 through the adhesion layer 912 by lamination.

Figure 9F:
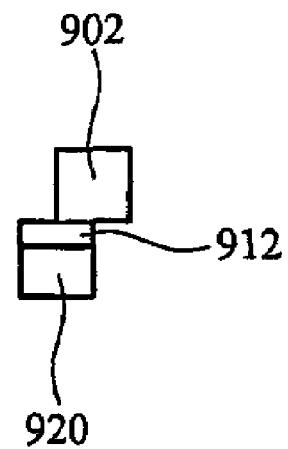

The stack chips are disposed up side down using the first and second film frame 906 and 908, thus, active surfaces of the first and second chips 902 and 920 are facing upward. The first film frame 906 is then removed. The independent second chips 920, separated from each other by a constant distance, are formed on the first chips 902, and the dependent chip stack structure are formed simultaneously, wherein each of the second chips 920 only stack with one single first chip 902. Next, as shown in FIG. 9f, an individual stack chip is taken using a pick and place robot arm.

Figure 10A:
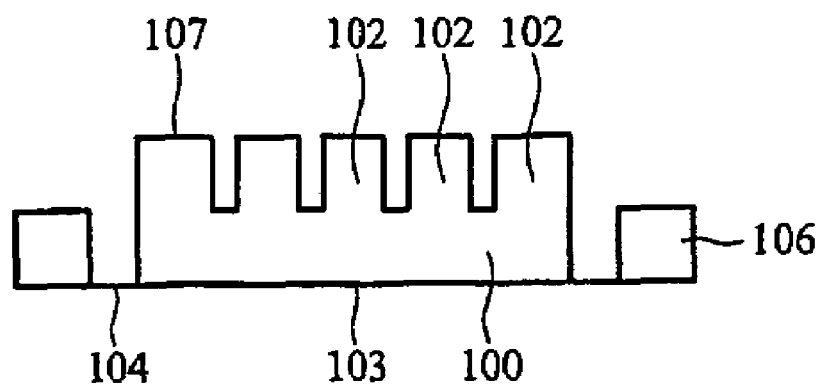
FIG. 10a~FIG. 10i illustrate a wafer stacking package method of yet another embodiment of the invention.

In FIG. 10a, a first wafer 100 with a chip array (not shown) is provided, wherein the chip array comprises a plurality of non-separated chips 102. Next, a backside 103 of the first wafer 100 is attached to a first film frame 106 comprising a tape 104. The wafer 100 is precut to a predetermined depth from the active surface 107 to define a plurality of first chips 102 arranged with the same distance therebetween, wherein the depth is less than thickness of the wafer 110.

Figure 10B:
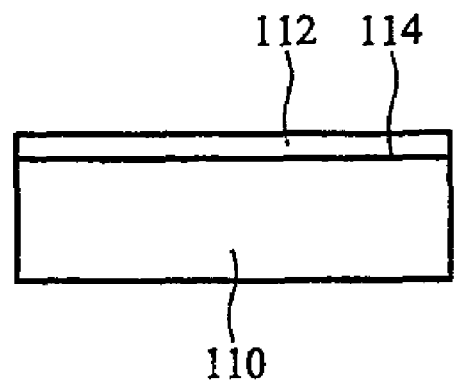
Figure 10:
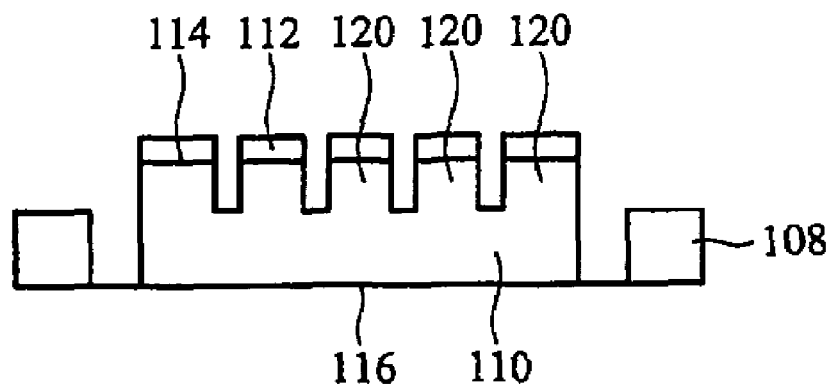
Figure 10:
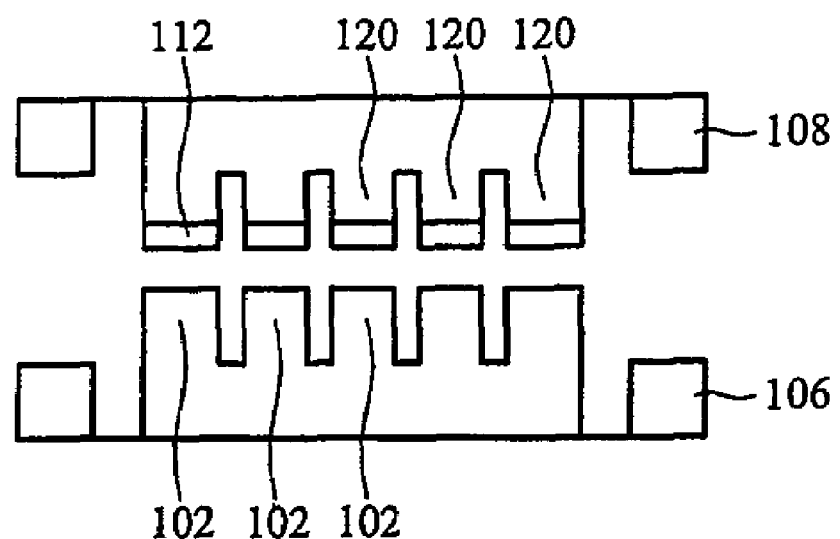
Figure 10E:
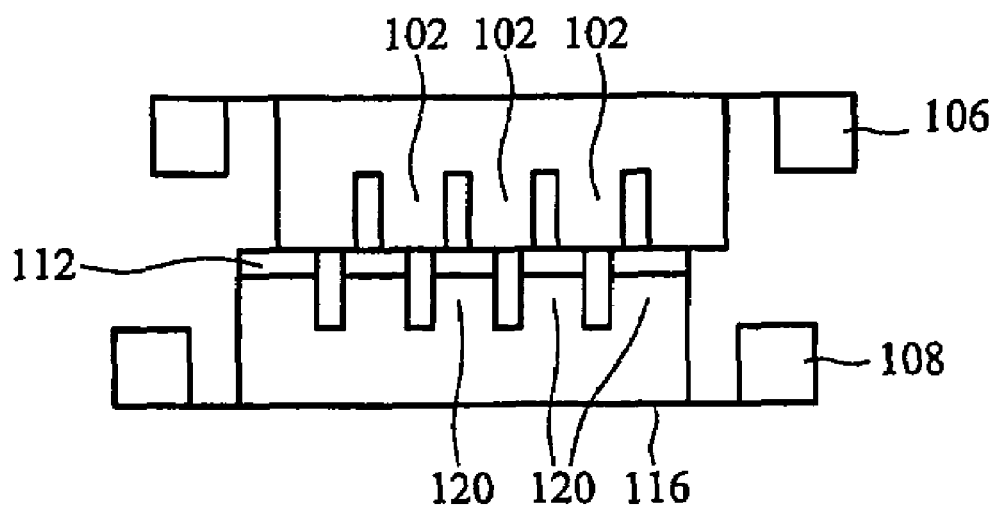

Referring to FIG. 10b, a second wafer 110 comprising a plurality of connected chips (not shown) is provided. An adhesion layer 112 is formed on active surfaces 114 of the second wafer 110, wherein the adhesion layer 112 covers the entire second wafer 110, or optionally covers a portion of the second wafer 110 overlapping the first chips 102. The adhesion layer 112 can comprise epoxy, thermal plastics and B-stage plastics formed by pasting with an automatic pasting apparatus, or pre-formed by direct bonding on the backside of the chips of the wafer.

Referring to FIG. 10c, backside 116 of chips of the second wafer 110 is bonded on a second film frame 108 comprising tapes. Next, the second wafer 110 is precut to a specified depth from the active surface 114, separating the second chips 120 to have a constant distance with each other, in which the cutting depth is less than thickness of the wafer 110.

Referring to FIG. 10d, chips 120 of the second wafer and the first chips 102 are interlaced to at least expose a portion of active surfaces of the second chips 120. Next, as shown in FIG. 9e, the second chips 120 are bonded to the first chips 102 through the adhesion layer 112 by lamination. Next, the stack chips 102 and 120 are disposed up side down using the first and second film frame 106 and 108.

Figure 10F:
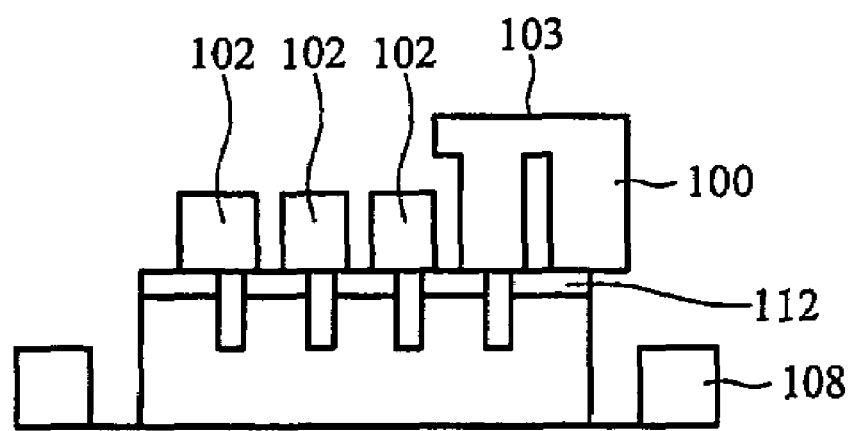
Figure 10G:
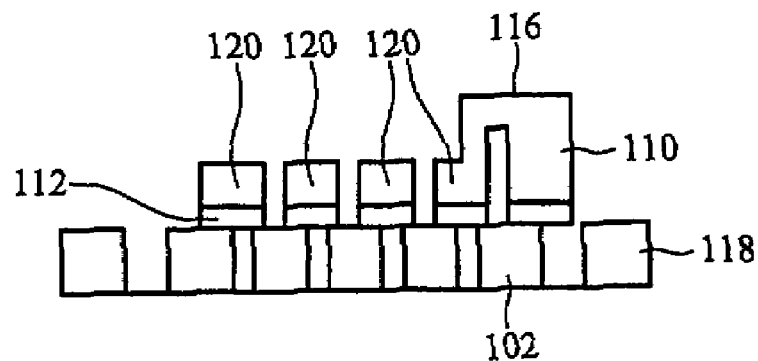

Referring to FIG. 10f, the first film frame 106 is then removed. The first wafer 100 is thinned from the backside 103 to form a plurality of completely independent first chips 102. Referring to FIG. 10g, backsides 107 of the first chips are attached to a third film frame 118, and the second wafer is formed upside down, thus, chips 120 of the second wafer is upward. Next, the second wafer is thinned from the backside 116 to form a plurality of independent second chips 120, presenting a constant distance therebetween. The thinning method can be mechanical polishing or chemical mechanical polishing.

Figure 10H:
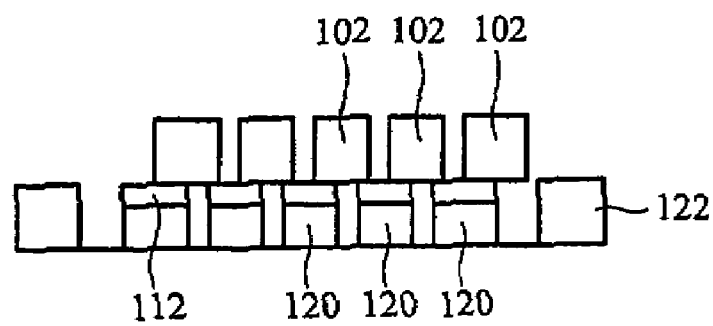
Figure 10I:
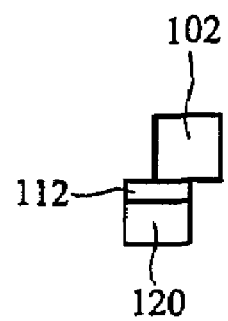

Referring to FIG. 10h, a fourth film frame 122 is formed on backside 116 of the second chips. The stack chips are turned to the upward active surface of the first and second chips 102 and 120. Next, the third film frame 118 is removed to form a plurality of independent second chips 120 with a constant distance therebetween on the first chips 102, thus, a plurality of independent stack chips are formed, wherein each of the second chips 120 only overlaps with one single first chip 102.

As shown in 10i, an independent stack chip can be taken out by a pick and place robot arm.

Figure 11A:
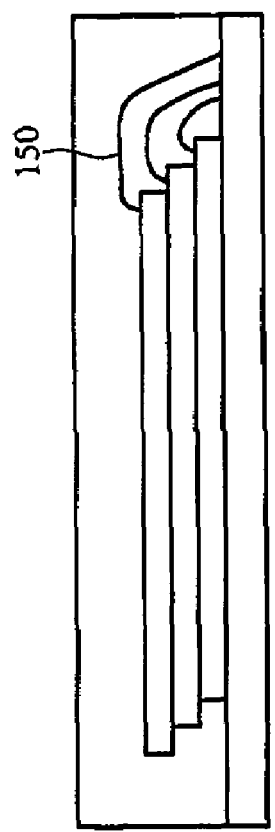
FIG. 11a show a cross section of a wire bonded wafer stacking package structure of an embodiment of the invention.
Figure 11B:
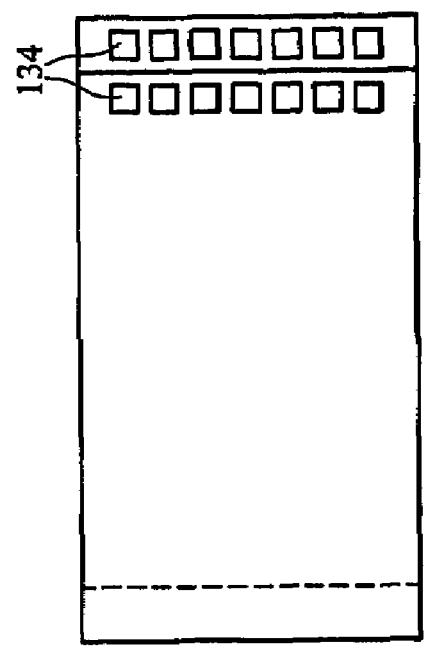
FIG. 11b and FIG. 11c show top views of wafer stacking package structures of embodiments of the invention.
Figure 11C:
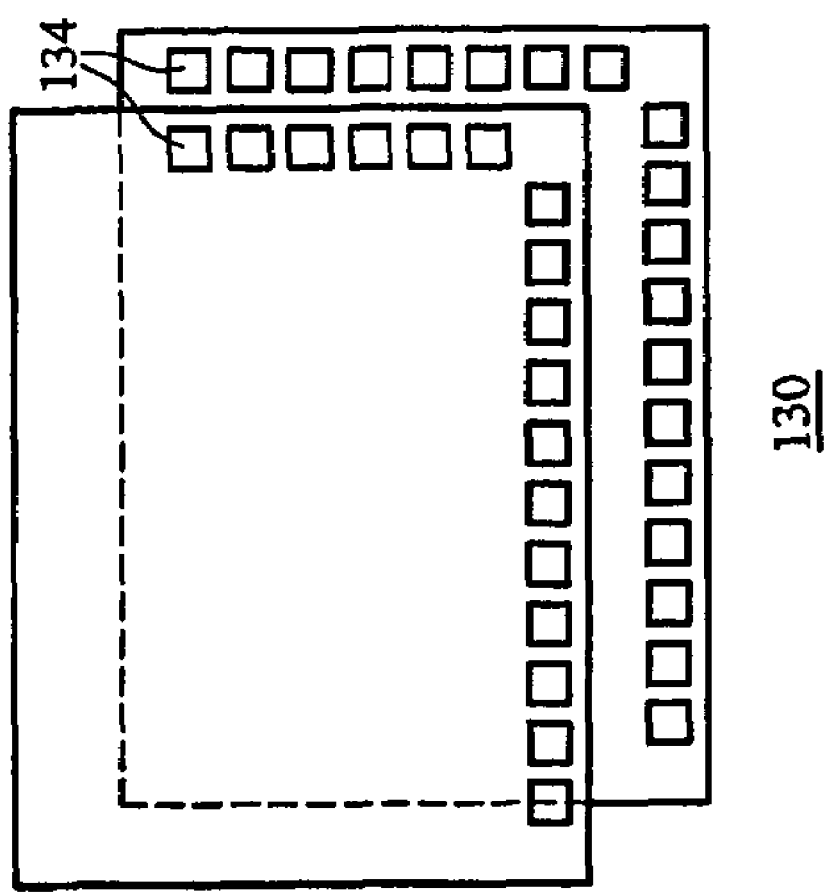

A preferred embodiment of the invention can be applied to chip structures with second chips larger, less or equal to first chips. If the second chips are larger than the first chips, the second chips can completely cover the active surfaces of the first chips respectively, or both are interlaced to expose portions of the second chips to be bonded by soldering with wires 150, as shown in FIG. 11a. If the second chips are smaller or equal to the first chips, the first and second chips are required to be interlaced to expose portions of the second chips. The stack chip structure 130 can comprise single side interlace, as shown in FIG. 11b, or dual side interlace, as shown in FIG. 11c.

Figure 12A:
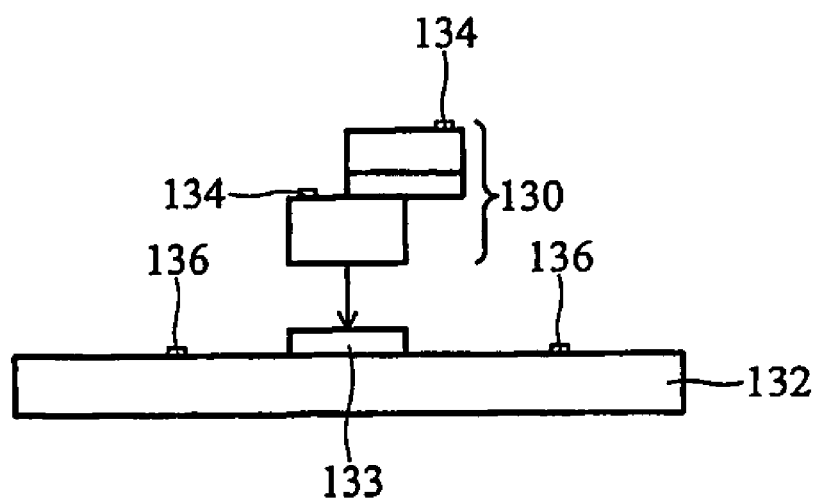
FIG. 12a~FIG. 12d illustrate a method for packaging stack chips of embodiments of the invention.

Further, referring to FIG. 12a, the stack chip 130 in the aforementioned embodiments can be taken out to be attached to a carrier 132, such as a substrate or a lead film frame, using plastics such as epoxy, thermal plastics or B-stage plastics. In addition, a line of solder pads 134 are formed on sides of the first and second chips 102 and 120 respectively, as shown in FIG. 11b and FIG. 11c. The first chips 102 and the second chips 120 could be single side interlaced or dual side interlaced when forming the stack chips. A plurality of connection solder pads 136 are formed on the carrier 136, wherein the solder connection pads 136 are aligned to the solder pads 134 of the first and second chips 102 and 120.

Figure 12B:
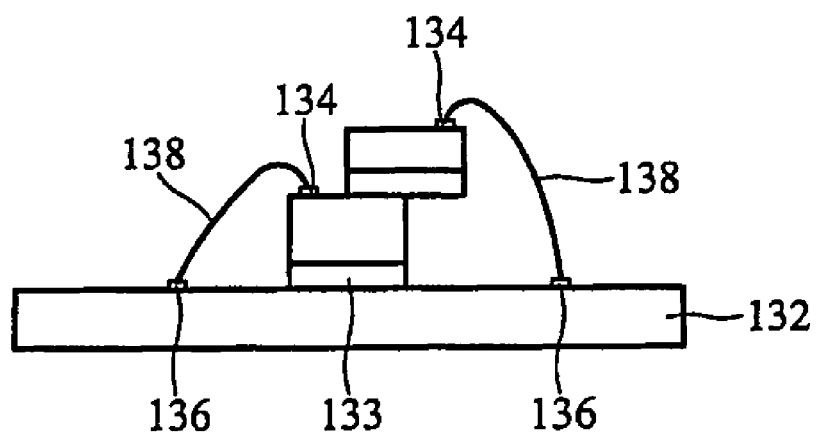
Figure 12C:
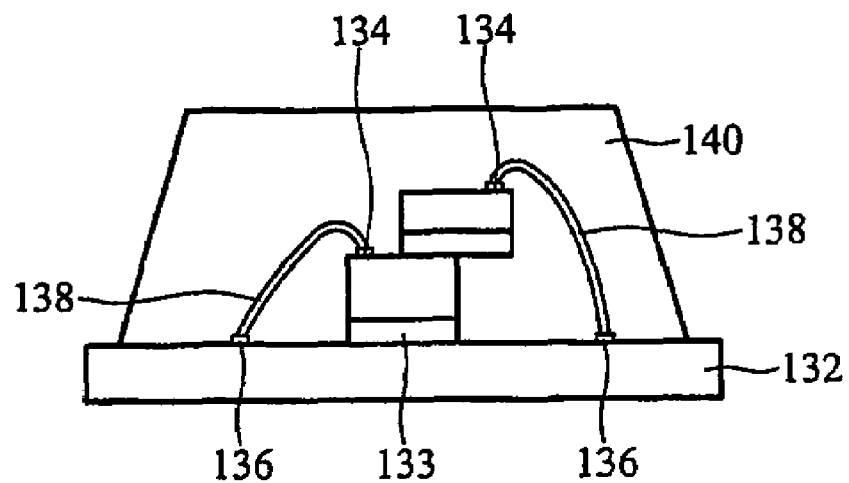
Figure 12D:
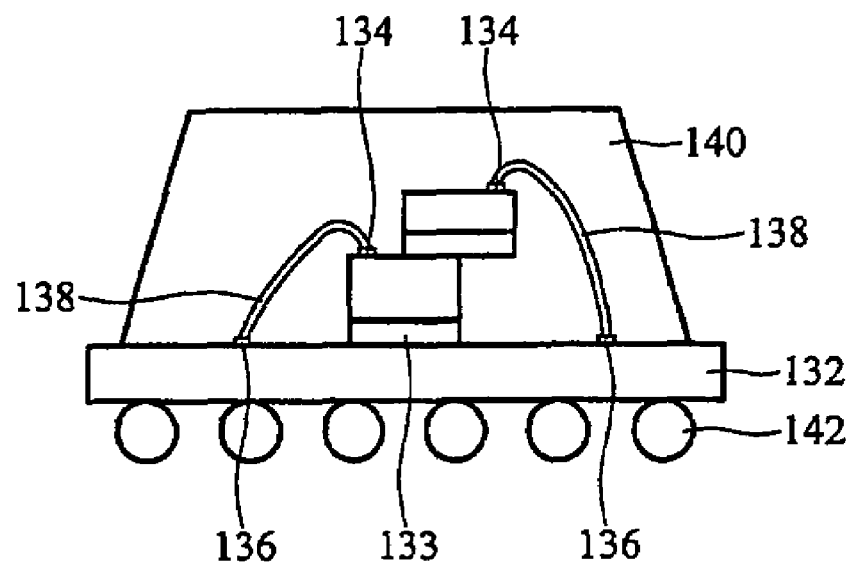

Referring to FIG. 12b, a wire bond process is performed, in which a plurality of conductive lines 138 are formed to connect the solder pads 134 on the stack chips and the connection solder pads 136 on the carrier 132. Referring to FIG. 12c, an encapsulation body 140, such as plastics, covers the chips 130 and the conductive lines 138. Referring to FIG. 12d, a plurality of solder balls 142 are formed on another side of the carrier 132 to sink heat, thus, a wafer level multi stack chip package is achieved. The step of forming solder balls 142 is not required when the carrier 132 is a lead frame.

According to preferred embodiment of the invention, a plurality of stack chips with a constant distance therebetween could be formed with one wafer-to-wafer alignment step. Consequently, conventional packaging technology, requiring one by one alignment of chips using a pick and place robot arm, could be simplified. In addition, chip damage and wafer breakage issues could be eliminated, and process efficiency and memory capacitance could be improved.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A wafer stacking package method, comprising:
    providing an array chip on a first wafer, comprising a plurality of independent first chips, formed by cutting the first wafer;
    providing a second wafer, comprising a plurality of connected second chips, wherein an adhesion layer is formed on active surfaces of the second chips;
    cutting gaps between the second chips to a specified depth;
    stacking the second chips overlying the first chips with the active surfaces of the second chips facing backsides of the first chips, wherein the first chips and the second chips are interlaecd to expose at least a portion of the active surfaces of the second chips, and each of the second chips overlaps with only one of the first chips; and
    thinning backsides of the second chips, wherein a plurality of independent and separated second chips are disposed overlying the first chips to form a plurality of stack chips.

2. The wafer stacking package method as claimed in claim 1, after the step of forming a plurality of independent and separated second chips overlying the first chips, further comprising:
    taking the stack chips out to be put on a side of a carrier;
    connecting the stack chips and the carrier with a plurality of conductive lines;
    covering the stack chips and the conductive line with a encapsulation body; and
    forming a plurality of solder balls on another side of the carrier.

3. The wafer stacking package method as claimed in claim 1, wherein the first chips are attached to a film frame with the active surfaces facing the film frame.

4. The wafer stacking package method as claimed in claim 1, wherein forming a plurality of stack chips comprises:
    attaching the connected second chips on a film frame; and
    directly stacking the second chips on the first chips using the film frame.

5. The wafer stacking package method as claimed in claim 1, wherein a portion of the active surface of each of the of the second chips are exposed after forming the stack chips.

6. The wafer stacking package method claimed in claim 5, wherein size of the second chips is larger than size of the first chips.

7. The wafer stacking package method as claimed in claim 5, wherein the first chips and the second chips are single side interlaced or dual side interlaced when forming the stack chips.

8. The wafer stacking package method as claimed in claim 5, wherein the independent first chips are formed by the method, comprising:
    attaching backsides of the first chips to a first film frame;
    cutting gaps between the first chips from an active surface of the first wafer to a specified depth;
    attaching active surfaces of the first chips to a second film frame for fastening; and
    thinning the first wafer from a backside thereof to form the independent first chips on the second film frame.

9. The wafer stacking package method as claimed in claim 1, wherein forming the stack chips is accomplished by laminating an adhesion layer on the second chips on backsides of the first chips.

10. The wafer stacking package method as claimed in claim 1, the independent first chips are formed by the method, comprising:
    thinning the first wafer from a backside thereof;
    attaching the backsides of the first chips to a first film frame; and
    cutting gaps between the first chips from an active surface of the first wafer to a specified depth to form the independent first chips.

11. A wafer stacking package method, comprising:
    providing an array chip on a first wafer, comprising a plurality of independent first chips, formed by cutting the first wafer;
    providing a thinned second wafer, comprising a plurality of connected second chips, wherein an adhesion layer is formed on active surfaces of the second chips;

cutting gaps between the second chips to a specified depth to form a plurality of independent and separated second chips; and stacking the second chips overlying the first chips with the active surfaces of the second chips facing backsides of the first chips, wherein the first chips and the second chips are interlaced to expose at least a portion of the active surfaces of the second chips, and each of the second chips overlaps with only one of the first chips, and stack chips comprising the second chips overlying the first chips are simultaneously formed.

12. The wafer stacking package method as claimed in claim 11, wherein after the step of forming the stack chips, comprising:

taking the stack chips out to be put on a side of a carrier;

connecting the stack chips and the carrier with a plurality of conductive lines;

covering the stack chips and the conductive line with a encapsulation body; and forming a plurality of solder balls on another side of the carrier.

13. The wafer stacking package method as claimed in claim 11, wherein a portion of each of the active surface of the second chips are exposed after forming the stack chips.

14. A wafer stacking package method as claimed in claim 13, wherein the first chips and the second chips are single side interlaced or dual side interlaced when forming the stack chips.

15. The wafer stacking package method as claimed in claim 11, wherein the independent first chips are formed by the method, comprising:

attaching the backsides of the first chips to a first film frame;

cutting gaps between the first chips from an active surface of the first wafer to a specified depth;

attaching active surfaces of the first chips to a second film frame for fastening; and thinning the first wafer from a backside thereof to form the independent first chips on the second film frame.

16. The wafer stacking package method as claimed in claim 11, the independent first chips are formed by the method, comprising:

thinning the first wafer from a backside thereof;

attaching the backsides of the first chips to a first film frame; and cutting gaps between the first chips from an active surface of the first wafer to a specified depth to form the independent first chips.

17. A wafer stacking package method, comprising:

providing a first wafer, comprising a plurality of first chips, formed by pre-cutting the first wafer;

providing a second wafer, comprising a plurality of connected second chips, wherein an adhesion layer is formed on active surfaces of the second chips;

cutting gaps between the second chips to a specified depth;

stacking the second chips overlying the first chips with the active surfaces of the second chips facing active surfaces of the first chips, wherein the first chips and the second chips are interlaced to expose at least a portion of the active surfaces of the second chips, and each of the second chips overlaps with only one of the first chips; and thinning backsides of the first chips and the second chips to simultaneously form a plurality of stack chips comprising the independent and separated second chips overlying the independent and separated first chips.

18. A wafer stacking package method as claimed in claim 17, after the step of forming a plurality of independent and separated second chips overlying the first chips, further comprises:

taking the stack chips out to be put on a side of a carrier;

connecting the stack chips and the carrier with a plurality of conductive lines;

covering the stack chips and the conductive line with a encapsulation body; and forming a plurality of solder balls on another side of the carrier.

19. The wafer stacking package method as claimed in claim 17, wherein a portion of the active surface of each of the second chips are exposed after forming the stack chips.

20. The wafer stacking package method as claimed in claim 19, wherein the first chips and the second chips are single side interlaced or dual side interlaced when forming the stack chips.

* * * * *